United States Patent
Ireland et al.

(10) Patent No.: US 9,347,985 B2
(45) Date of Patent: May 24, 2016

(54) VIA CHAIN TESTING STRUCTURE AND METHOD

(75) Inventors: Philip J. Ireland, Nampa, ID (US); Wen-Sung Chiang, Hsinchu (TW)

(73) Assignee: NANYA TECHNOLOGY CORP., Gueishan Dist., Taoyuan (TW)

(*) Notice: Subject to any disclaimer, the term of this patent is extended or adjusted under 35 U.S.C. 154(b) by 531 days.

(21) Appl. No.: 13/197,785

(22) Filed: Aug. 4, 2011

(65) Prior Publication Data

US 2013/0034119 A1    Feb. 7, 2013

(51) Int. Cl.
*G01K 13/12* (2006.01)
*G01R 31/28* (2006.01)

(52) U.S. Cl.
CPC ........ *G01R 31/2853* (2013.01); *G01R 31/2875* (2013.01); *G01R 31/2896* (2013.01)

(58) Field of Classification Search
USPC .................. 438/714; 714/724, 726, 727, 733; 374/45, 57, 141
See application file for complete search history.

(56) References Cited

U.S. PATENT DOCUMENTS

| | | | |
|---|---|---|---|
| 4,483,629 A * | 11/1984 | Schwarz et al. | 374/57 |
| 5,898,706 A * | 4/1999 | Dufresne et al. | 714/745 |
| 6,513,000 B1 * | 1/2003 | Toda | 703/13 |
| 6,636,064 B1 * | 10/2003 | Satya et al. | 324/750.3 |
| 6,971,791 B2 * | 12/2005 | Borden et al. | 374/5 |
| 8,217,671 B2 * | 7/2012 | Agarwal et al. | 324/750.03 |
| 8,323,991 B2 * | 12/2012 | Fischer et al. | 438/17 |
| 2005/0214956 A1 * | 9/2005 | Li et al. | 438/14 |
| 2006/0192584 A1 * | 8/2006 | Kang et al. | 324/765 |
| 2009/0058455 A1 * | 3/2009 | Ko et al. | 324/765 |
| 2010/0164508 A1 * | 7/2010 | Ping et al. | 324/537 |
| 2011/0097826 A1 | 4/2011 | Fischer | |
| 2012/0051392 A1 * | 3/2012 | Grillberger et al. | 374/57 |

* cited by examiner

*Primary Examiner* — Mirellys Jagan
(74) *Attorney, Agent, or Firm* — Winston Hsu; Scott Margo

(57) ABSTRACT

A via chain testing structure includes: a substrate; a dielectric layer disposed on the substrate; a first via chain disposed on dielectric layer; a second via chain, being disposed on the dielectric on both sides of the first via chain and in thermal proximity with the first via chain; a first heating source disposed under the substrate, for providing thermal heat to the first via chain; and an electrical current source for heating the second via chain so the second via chain acts as a second heating source for the first via chain.

11 Claims, 1 Drawing Sheet

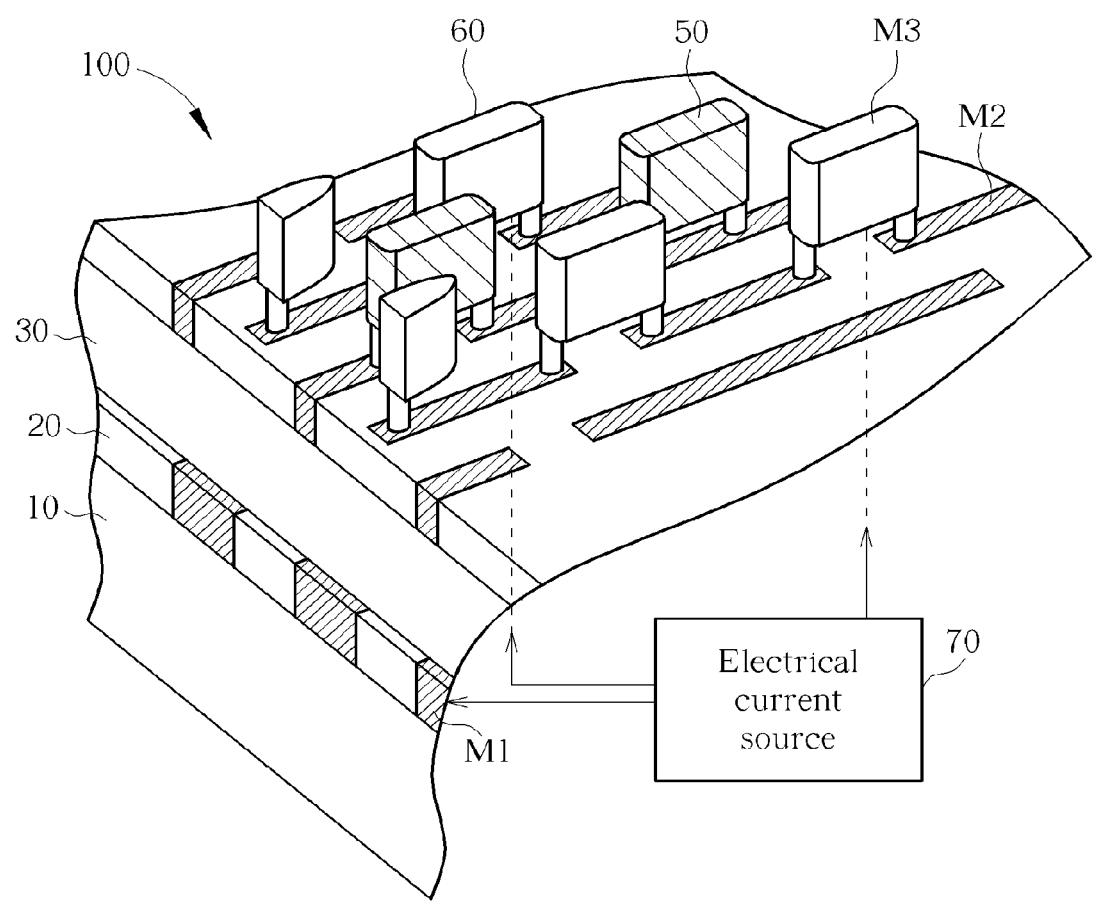

VIA CHAIN TESTING STRUCTURE AND METHOD

BACKGROUND OF THE INVENTION

1. Field of the Invention

The invention relates to testing of via chains, and more particularly, to a system and method for testing via chains quickly and efficiently by increasing the ambient temperature of the via chain.

2. Description of the Prior Art

Via chains are common structures in die packages, used to vertically link metal layers. When a via chain is placed under stress, electromigration (EM) occurs, whereby momentum from the 'electron wind' is passed to ions in the metallic lattice, and these ions are then transported to neighbouring materials. This constant migration will eventually result in vacancies collecting under the vias, which leads to failure of the structure. Therefore, each via chain has a particular lifetime associated with it. As modern semiconductor devices have densely packed interconnect structures, failure of via chains becomes a serious design issue. In order to predict when failure will occur, Black's equation is employed. Black's equation is shown below as equation (1).

$$\text{MTTF(Mean Time To Failure)} = A\omega j^{-n} e^{Q/\kappa T} \quad (1)$$

Where:
A=a constant
J=current density
N=model parameter
Q=activation energy
κ=Boltzmann constant
T=absolute temperature
ω=metal wire width As demonstrated by the above equation, EM measurements are very dependent upon temperature. One way of determining lifetime and EM measurements, therefore, is to stress the via chain using heat and electrical current. Joule heating is generated when electrical current is passed through the via chain. High Joule heating, however, complicates the data measurements by introducing other mechanisms into the system that are not related to die failure, and manufacturers tend to eliminate this method if possible. If only thermal heating is used, however, the maximum temperature that can be reached at wafer level is limited by the wafer chuck, which typically has a high temperature threshold of 150° C. At package level, the dies can be heated in ovens, but this process is again limited to a maximum temperature of about 200° C.; above this temperature, intermetallic formation will occur between Gold and Aluminium in the package structure.

It is therefore an objective in the field to find a via chain testing method that can place the via chain under stress at a high temperature ambience while limiting the amount of Joule heating that is used.

SUMMARY OF THE INVENTION

This in mind, the invention aims to provide a means for testing a standard EM via chain that can avoid the disadvantages of the prior art, and save time when testing.

An exemplary embodiment of a via chain testing structure comprises: a substrate; a dielectric layer disposed on the substrate; a first via chain disposed on dielectric layer; a second via chain, being disposed on the dielectric on both sides of the first via chain and in thermal proximity with the first via chain; a first heating source disposed under the substrate, for providing thermal heat to the first via chain; and an electrical current source for heating the second via chain so the second via chain acts as a second heating source for the first via chain.

A testing method according to the exemplary embodiment comprises: providing a substrate having a dielectric layer disposed thereon; disposing the first via chain on the dielectric layer; disposing a second via chain on the dielectric layer on both sides of the first via chain, and in thermal proximity with the first via chain; utilizing a first heating source to provide thermal heat to the first via chain; and utilizing an electrical current to provide Joule heating to the second via chain to heat the second via chain so the second via chain acts as a second heating source.

In addition to the first heating source and second heating source, a third heating source is also provided by means of a layer of first metal interconnection disposed beneath the first via chain and isolated by the dielectric layer, wherein the first heating source, the second heating source and the third heating source are additive. In addition, the electrical current can further be used to directly heat the first via chain.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The FIGURE is an illustration of the via chain testing structure according to an exemplary embodiment of the present invention.

DETAILED DESCRIPTION

As detailed in the above, the EM industry prefers not to use high Joule heating to heat a via chain which is being tested. The temperatures that can be reached via thermal heating alone, however, are limited.

In order to overcome this problem, the present disclosure introduces a first metal interconnection below the first via chain isolated by a dielectric layer and a second via chain, having double the surface area of the chain to be tested. This first metal interconnection primarily acts as a heater for the first via chain. This second via chain primarily acts as a heater for the first via chain. For the purposes of clarity, the first metal interconnection will herein be referred to as $\text{metal}_{HEATER}$, the first via chain (or chain to be tested) will herein be referred to as via $\text{chain}_{TEST}$ and the second via chain will be referred to as via $\text{chain}_{HEATER}$.

Please refer to the FIGURE, which illustrates an exemplary embodiment 100 of the present invention. As shown in the diagram, $\text{metal}_{HEATER}$ 20 is placed on a substrate 10, also comprising a wafer chuck (not shown) which is for providing thermal heat to via $\text{chain}_{TEST}$ 50. As mentioned, the chuck temperature is limited to an upper threshold of 150 C. Via $\text{chain}_{TEST}$ is disposed on the dielectric layer 30, directly above $\text{metal}_{HEATER}$ 20. Via $\text{chain}_{HEATER}$ 60 is also disposed on the dielectric layer 30 and surrounds via $\text{chain}_{TEST}$ 50 on both sides.

At the same time that the first heating source (wafer chuck) is providing thermal heat to via $\text{chain}_{TEST}$ 50, electric currents will be passed through $\text{metal}_{HEATER}$ 20 and via $\text{chain}_{HEATER}$ 60 from electrical current source 70 creating Joule heating effect. Joule heating can heat $\text{metal}_{HEATER}$ and via $\text{chain}_{HEATER}$ 60 to a far higher temperature than thermal heating alone. As via $\text{chain}_{TEST}$ 50 is in close thermal proximity with $\text{Metal}_{HEATER}$ 20 and via $\text{chain}_{HEATER}$ 60, the temperature induced in $\text{Metal}_{HEATER}$ 20 and via $\text{chain}_{HEATER}$ 60 caused by the Joule heating will also heat via $\text{chain}_{TEST}$ 50 due to the thermal conduction between the first metal interconnection and the two via chains. In this way, the ambient temperature of via $\text{chain}_{TEST}$ 50 is increased.

As mentioned above, Joule heating causes certain mechanisms that affect data measurements used for determining lifetime; however, as $\text{metal}_{HEATER}$ 20 and via $\text{chain}_{HEATER}$ 60 are merely being used as heaters for via $\text{chain}_{TEST}$ 50 and are not being tested themselves, these mechanisms can be ignored. The Joule heating-influenced mechanisms will only occur in $\text{metal}_{HEATER}$ 20 and via $\text{chain}_{HEATER}$ 60 whereas via $\text{chain}_{TEST}$ 50 will only experience the thermal effect provided by $\text{metal}_{HEATER}$ 20 and via $\text{chain}_{HEATER}$ 60. This thermal effect will be added to the thermal effect directly provided to via $\text{chain}_{TEST}$ 50 by the chuck, thereby enabling via $\text{chain}_{TEST}$ 50 to be stressed at a much higher temperature than conventional methods would allow while avoiding high amounts of Joule heating being applied directly to via $\text{chain}_{TEST}$ 50.

Please refer again to the FIGURE, which is a cross-section of the testing structure 100, substrate 10, $\text{metal}_{HEATER}$ 20 and dielectric layer 30. As shown in the diagram, a layer of first metal interconnection, M1 $\text{metal}_{HEATER}$ 20, is placed on the substrate 10 and a dielectric layer 30 is placed between $\text{metal}_{HEATER}$ 20 and via $\text{chain}_{TEST}$ 50 for electrical isolation. Via $\text{chain}_{TEST}$ 50 links M2 to another metal layer M3. Via $\text{chain}_{HEATER}$ 60 also links M2 to M3, and surrounds via $\text{chain}_{TEST}$ 50 such that via $\text{chain}_{HEATER}$ 60 and via $\text{chain}_{TEST}$ 50 are in thermal proximity.

As the purpose of the heating process is to heat via $\text{chain}_{TEST}$ 50 until failure occurs, $\text{metal}_{HEATER}$ 20 and via $\text{chain}_{HEATER}$ 60 will need to be driven to high temperatures at which they may also fail. In order to prevent this failure, $\text{metal}_{HEATER}$ 20 and via $\text{chain}_{HEATER}$ 60 are kept at a slightly lower temperature than via $\text{chain}_{TEST}$ 50 by using a small level of Joule heating in via $\text{chain}_{TEST}$ 50, thus ensuring that $\text{metal}_{HEATER}$ 20 and via $\text{chain}_{HEATER}$ 60 can remain operational throughout the testing procedure.

Therefore, via $\text{chain}_{TEST}$ 50 is provided with three main sources of heat: direct thermal heat from the chuck; thermal heat from $\text{metal}_{HEATER}$ 20; and thermal heat from via $\text{chain}_{HEATER}$ 60. As mentioned above, it is also possible to apply a small amount of Joule heating directly to via $\text{chain}_{TEST}$ 50, although the amount that can be applied is limited by current density considerations. These sources of heat are all additive such that the maximum temperature of via $\text{chain}_{TEST}$ 50 can approach almost 400 C.

Initially, the chuck heats via $\text{chain}_{TEST}$ 50; ideally, it is left to 'soak' for some time to get via $\text{chain}_{TEST}$ 50 to the maximum temperature. Then, electrical currents can be applied to $\text{metal}_{HEATER}$ 20 and via $\text{chain}_{HEATER}$ 60, which causes the temperature to rise rapidly. Please note that, in some embodiments, M1 may not be used as a source of heat. Additionally, at a certain point in the testing procedure, a small amount of Joule heating may be applied directly to via $\text{chain}_{TEST}$ 50.

In addition, it is preferable that via $\text{chain}_{HEATER}$ 60 and via $\text{chain}_{TEST}$ 50 are long via chains, as this allows a more even heat pattern along the via chain to be achieved. It is also preferable that via $\text{chain}_{HEATER}$ 60 has a high resistance for maintaining the heat pattern along the chain, as the temperature drops more slowly at each end. The present invention also supports other via chain structures that help to achieve this even heat distribution; for example, via chain structures that have a greater number of vias at each end than in the middle.

In summary, the present invention provides a structure and related method for performing EM testing of a first via chain that is not limited by chuck temperature or melting temperatures of package level components, and also avoids the adverse effects typically associated with Joule heating. By utilizing Joule heating to directly heat a second via chain surrounding the first via chain as well as the additive effects of a metal heater below the first via chain, the first via chain can be thermally heated to temperatures exceeding those dictated by the prior art.

Those skilled in the art will readily observe that numerous modifications and alterations of the device and method may be made while retaining the teachings of the invention.

What is claimed is:

1. A via chain testing structure, comprising:
   a substrate;
   a dielectric layer disposed on the substrate;
   a first via chain disposed on the dielectric layer;
   a second via chain, being disposed on the dielectric layer on both sides of the first via chain and in thermal proximity with the first via chain;
   a first heating source disposed under the substrate, for providing thermal heat to the first via chain; and
   an electrical current source for heating the second via chain so the second via chain acts as a second heating source for the first via chain;
   wherein the electrical current source also heats the first via chain and a metal layer.

2. The via chain testing structure of claim 1, wherein the first heating source is a wafer chuck.

3. The via chain testing structure of claim 1, wherein the second via chain is double the surface area of the first via chain.

4. The via chain testing structure of claim 1, wherein the first via chain and the second via chain are both formed of lines of vias, and when the second via chain is heated using the electrical current source, an even heat distribution will be maintained along the second via chain.

5. The via chain testing structure of claim 1, wherein the metal layer comprises:
   a layer of first metal interconnection being disposed on the substrate and isolated from the first via chain by the dielectric layer, wherein the electrical current source heats the layer of first metal interconnection so the layer of first metal interconnection acts as a third heating source for the first via chain.

6. The via chain testing structure of claim 5, wherein the first heating source, the second heating source and the third heating source are additive.

7. A method for testing a first via chain, comprising:
   providing a substrate having a dielectric layer disposed thereon;
   disposing the first via chain on the dielectric layer;
   disposing a second via chain on the dielectric layer on both sides of the first via chain, and in thermal proximity with the first via chain;
   utilizing a first heating source disposed under the substrate to provide thermal heat to the first via chain; and
   utilizing an electrical current to only provide Joule heating to the second via chain to heat the second via chain so the second via chain acts as a second heating source for the first via chain, wherein the electrical current source also heats the first via chain and a metal layer.

8. The via chain testing method of claim 7, wherein the second via chain is at least double the surface area of the first via chain.

9. The via chain testing method of claim 7, wherein the first via chain and the second via chain are both formed of lines of vias, and when the second via chain is heated using the electrical current source, an even heat distribution will be maintained along the second via chain.

10. The via chain testing method of claim 7, wherein the metal layer is formed by:
   providing a layer of first metal interconnection positioned underneath the first via chain and isolated from the first via chain by the dielectric layer; and
   utilizing the electrical current to provide Joule heating to the layer of first metal interconnection so the layer of first metal interconnection acts as a third heating source for the first via chain.

11. The via chain testing method of claim 10, wherein the first heating source, the second heating source and the third heating source are additive.

\* \* \* \* \*